(12) United States Patent
Kurimoto et al.

(10) Patent No.: US 11,746,439 B2
(45) Date of Patent: Sep. 5, 2023

(54) PRESSURE CONTAINER FOR CRYSTAL PRODUCTION

(71) Applicants: THE JAPAN STEELWORKS, LTD., Tokyo (JP); TOHOKU UNIVERSITY, Sendai (JP)

(72) Inventors: Kouhei Kurimoto, Muroran (JP); Quanxi Bao, Muroran (JP); Mutsuo Ueda, Muroran (JP); Yuji Sasagawa, Muroran (JP); Masaya Morimoto, Muroran (JP); Toru Ishiguro, Sendai (JP); Shigefusa Chichibu, Sendai (JP)

(73) Assignees: JAPAN STEEL WORKS M&E, INC., Muroran (JP); TOHOKU UNIVERSITY, Sendai (JP)

( * ) Notice: Subject to any disclaimer, the term of this patent is extended or adjusted under 35 U.S.C. 154(b) by 102 days.

(21) Appl. No.: 16/499,435

(22) PCT Filed: Apr. 5, 2018

(86) PCT No.: PCT/JP2018/014627
§ 371 (c)(1),
(2) Date: Sep. 30, 2019

(87) PCT Pub. No.: WO2018/186475
PCT Pub. Date: Oct. 11, 2018

(65) Prior Publication Data
US 2020/0048791 A1 Feb. 13, 2020

(30) Foreign Application Priority Data

Apr. 7, 2017 (JP) .................. 2017-076804

(51) Int. Cl.
*C30B 35/00* (2006.01)
*C30B 7/10* (2006.01)
*C30B 29/38* (2006.01)

(52) U.S. Cl.
CPC .............. *C30B 35/002* (2013.01); *C30B 7/10* (2013.01); *C30B 29/38* (2013.01)

(58) Field of Classification Search
CPC ..... C30B 29/38; C30B 29/406; C30B 35/002; C30B 7/10; C30B 7/105
See application file for complete search history.

(56) References Cited

U.S. PATENT DOCUMENTS 7,036,677 B1    5/2006  Funck et al.
2002/0189531 A1  12/2002  Dwilinski et al.
(Continued)

FOREIGN PATENT DOCUMENTS

CN    1369046 A    9/2002
EP    1 837 420 A1  9/2007
(Continued)

OTHER PUBLICATIONS

Office Action dated Jan. 26, 2021 by the State Intellectual Property Office of P.R. China in counterpart Chinese Patent Application No. 201880023029.8.
(Continued)

*Primary Examiner* — Hua Qi
(74) *Attorney, Agent, or Firm* — Sughrue Mion, PLLC

(57) ABSTRACT

A pressure container for crystal production having excellent corrosion-resistance is provided. This pressure container produces crystals within the container using a seed crystal, a mineralizer, a raw material, and ammonia in a supercritical state or a subcritical state as a solvent. The pressure container has Ag present over the entire surface of at least the inner surface thereof in contact with the solvent. The Ag can be disposed by one or a combination of two or more among, for instance, Ag lining, Ag welding, and Ag plating. The mineralizer is preferably a fluorine mineralizer containing no halogen atoms other than fluorine.

18 Claims, 10 Drawing Sheets

(56) References Cited

U.S. PATENT DOCUMENTS

| | | |
|---|---|---|
| 2002/0192507 A1 | 12/2002 | Dwilinski et al. |
| 2004/0089221 A1 | 5/2004 | Dwilinski et al. |
| 2004/0124434 A1 | 7/2004 | D'Evelyn et al. |
| 2004/0124435 A1 | 7/2004 | D'Evelyn et al. |
| 2004/0139912 A1 | 7/2004 | Tomasz Dwilinski et al. |
| 2004/0238810 A1 | 12/2004 | Dwilinski et al. |
| 2004/0244680 A1 | 12/2004 | Dwilinski et al. |
| 2004/0251471 A1 | 12/2004 | Dwilinski et al. |
| 2004/0255840 A1 | 12/2004 | Dwilinski et al. |
| 2004/0261692 A1 | 12/2004 | Dwilinski et al. |
| 2005/0087124 A1 | 4/2005 | Dwilinski et al. |
| 2005/0098095 A1 | 5/2005 | D'Evelyn et al. |
| 2005/0249255 A1 | 11/2005 | Dwilinski et al. |
| 2006/0032428 A1 | 2/2006 | Dwilinski et al. |
| 2006/0037530 A1 | 2/2006 | Dwilinski et al. |
| 2006/0054076 A1 | 3/2006 | Dwilinski et al. |
| 2006/0138431 A1 | 6/2006 | Dwilinski et al. |
| 2006/0169996 A1 | 8/2006 | D'Evelyn et al. |
| 2007/0040181 A1 | 2/2007 | D'Evelyn et al. |
| 2007/0040240 A1 | 2/2007 | Dwilinski et al. |
| 2007/0158785 A1 | 7/2007 | D'Evelyn et al. |
| 2007/0215887 A1 | 9/2007 | D'Evelyn et al. |
| 2008/0006844 A1 | 1/2008 | D'Evelyn et al. |
| 2008/0008855 A1 | 1/2008 | D'Evelyn et al. |
| 2008/0050855 A1 | 2/2008 | Dwilinski et al. |
| 2008/0108162 A1 | 5/2008 | Dwilinski et al. |
| 2009/0013926 A1* | 1/2009 | Sasagawa ............... B01J 3/042 117/200 |
| 2009/0280024 A1 | 11/2009 | Yamamura et al. |
| 2009/0315012 A1 | 12/2009 | Dwilinski et al. |
| 2011/0150686 A1 | 6/2011 | Trushin et al. |
| 2012/0017825 A1 | 1/2012 | D'Evelyn et al. |
| 2014/0205840 A1 | 7/2014 | Aoki et al. |
| 2015/0023862 A1 | 1/2015 | Ishiguro et al. |
| 2015/0182928 A1 | 7/2015 | Sasagawa et al. |
| 2016/0319457 A1 | 11/2016 | D'Evelyn et al. |
| 2018/0187328 A1 | 7/2018 | Ishiguro et al. |

FOREIGN PATENT DOCUMENTS

| | | | |
|---|---|---|---|
| JP | 2006-513122 A | | 4/2006 |
| JP | 2006-193355 A | | 7/2006 |
| JP | 2007-056320 A | | 3/2007 |
| JP | 2010-222247 A | | 10/2010 |
| JP | 2012-017212 A | | 1/2012 |
| JP | 2012-171863 A | | 9/2012 |
| JP | 2012171863 A | * | 9/2012 |
| JP | 2012-250908 A | | 12/2012 |
| JP | WO2012-176318 A1 | | 12/2012 |
| JP | 2013-203652 A | | 10/2013 |
| JP | 2015-040170 A | | 3/2015 |
| JP | 2015040170 A | * | 3/2015 |
| JP | 2015-140288 A | | 8/2015 |
| WO | 2012176318 A | | 12/2012 |

OTHER PUBLICATIONS

International Search Report (PCT/ISA/210) dated Jun. 19, 2018 issued by the International Searching Authority in International Application No. PCT/JP2018/014627.
Written Opinion (PCT/ISA/237) dated Jun. 19, 2018 issued by the International Searching Authority in International Application No. PCT/JP2018/014627.
Extended European Search Report dated Oct. 19, 2020 issued by the European Patent Office in counterpart European Application No. 18781452.0.
Office Action dated Apr. 28, 2023, issued by the Korean Intellectual Property Office in Korean Patent Application No. 10-2023-7012144.

* cited by examiner

[FIG. 1]
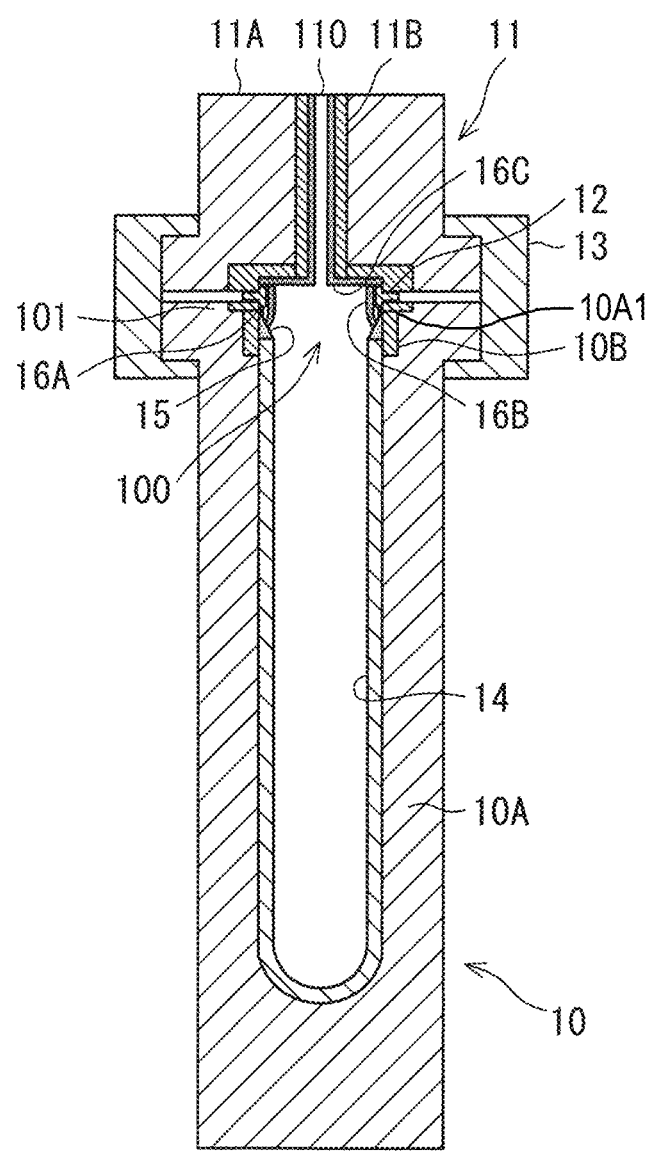

[FIG. 2]
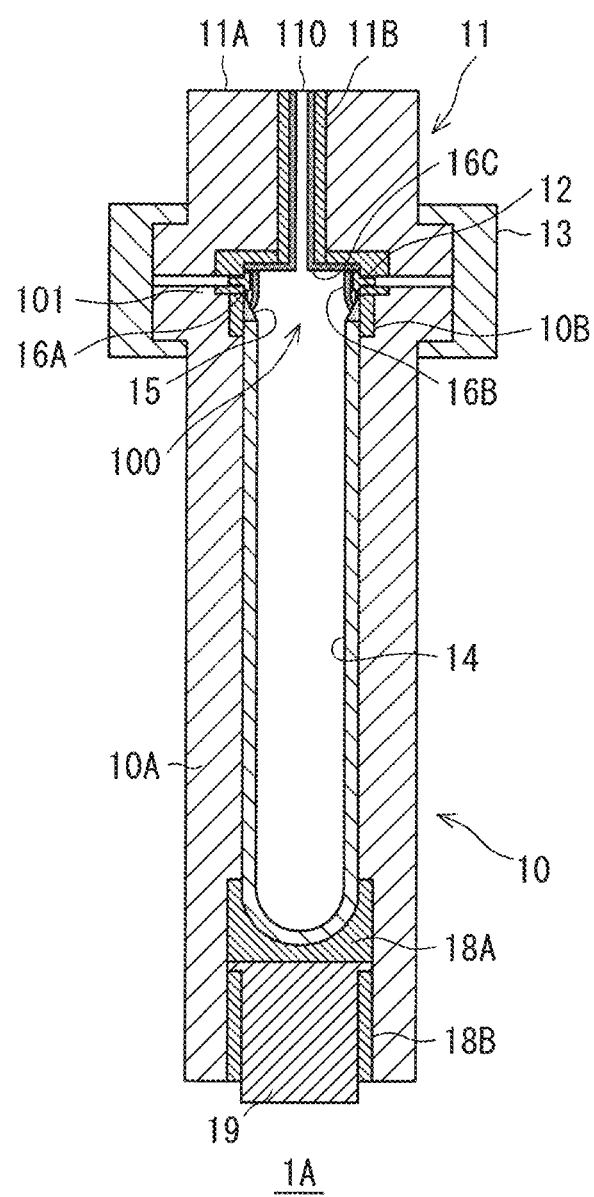

[FIG. 3]
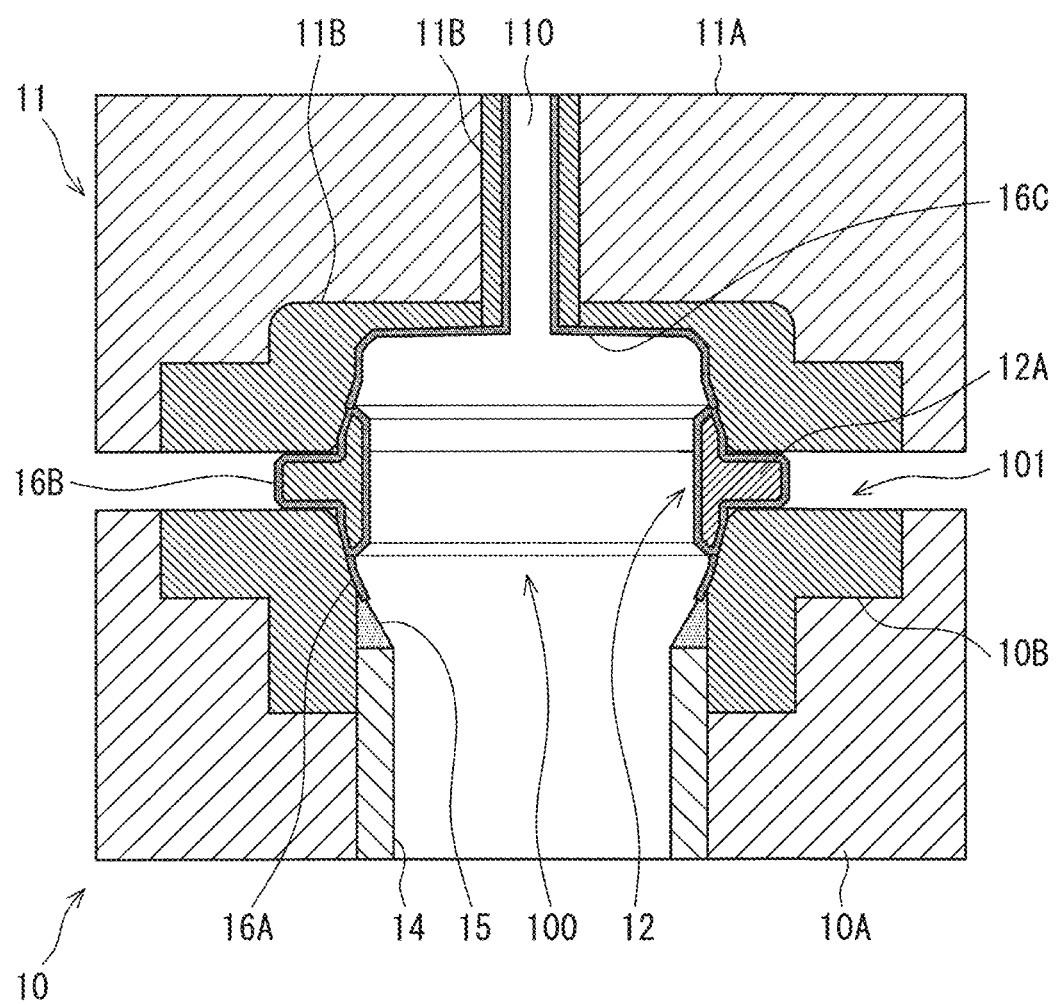

[FIG. 4]
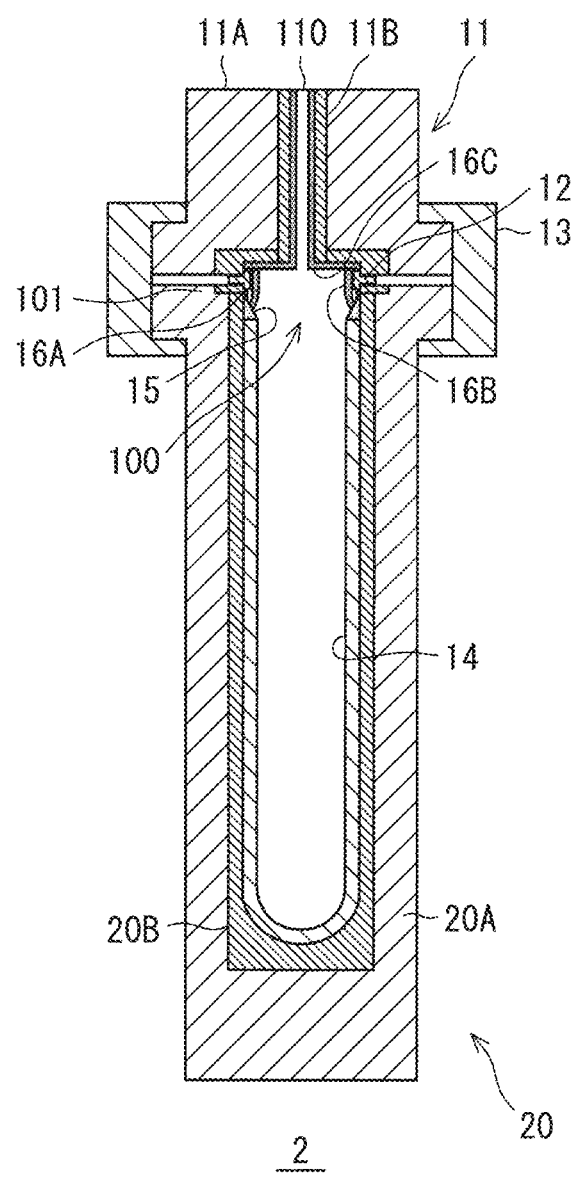

[FIG. 5]
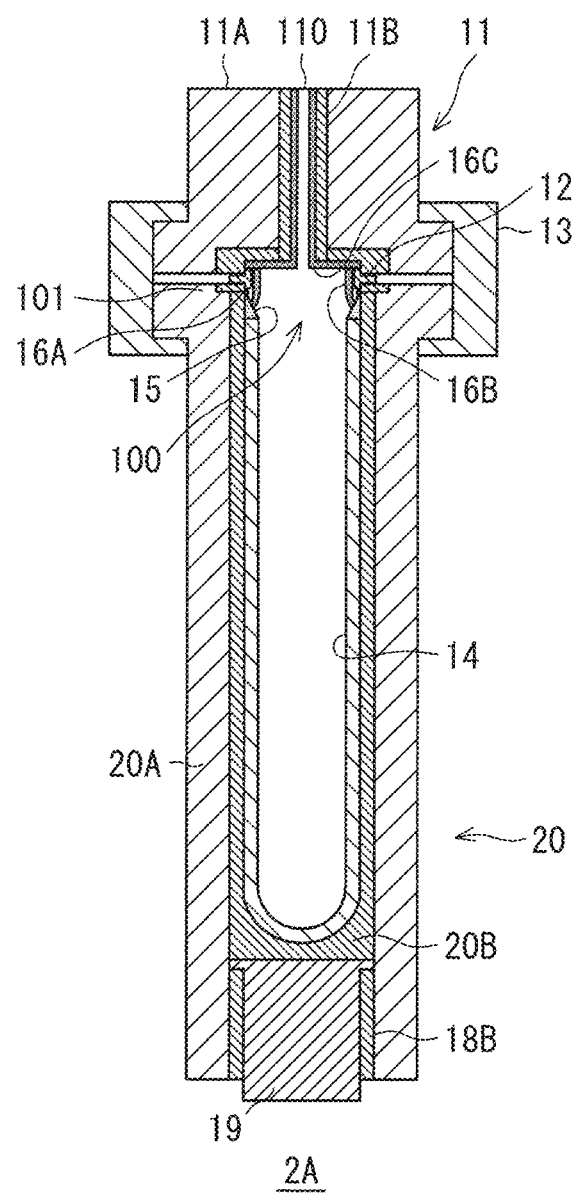

[FIG. 6]
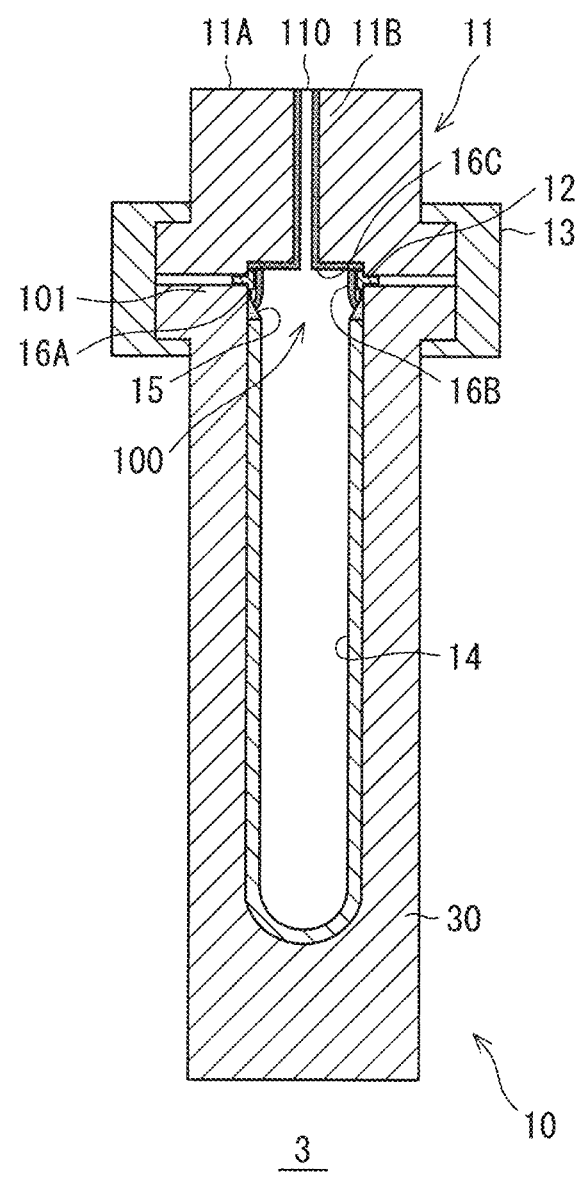

[FIG. 7]
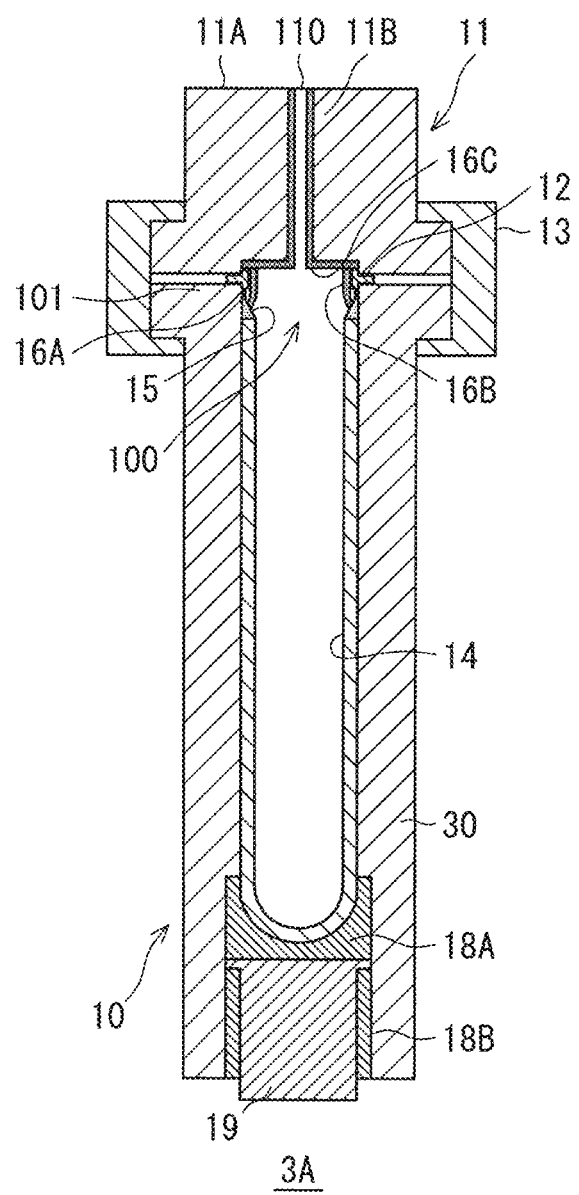

[FIG. 8]
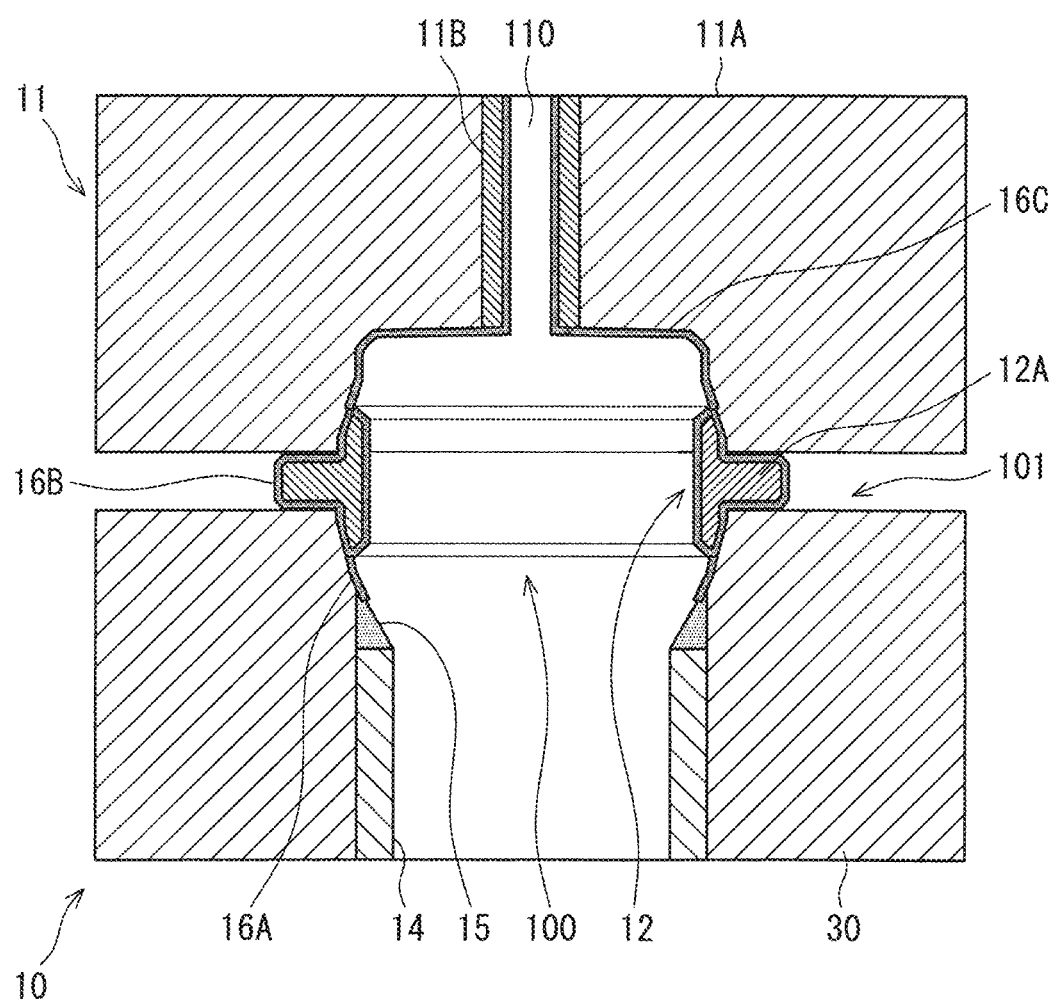

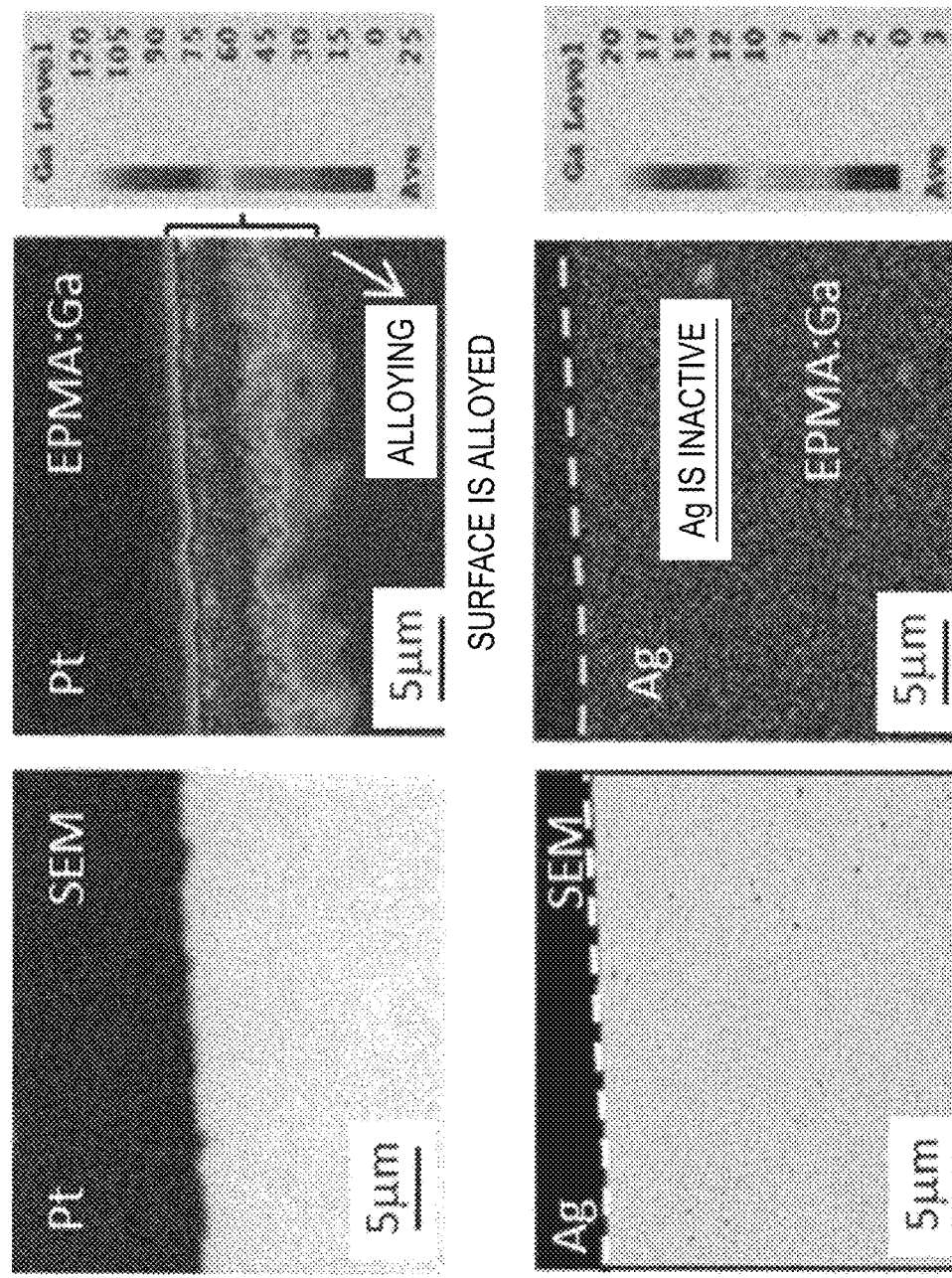
[FIG. 9]

[FIG. 10]
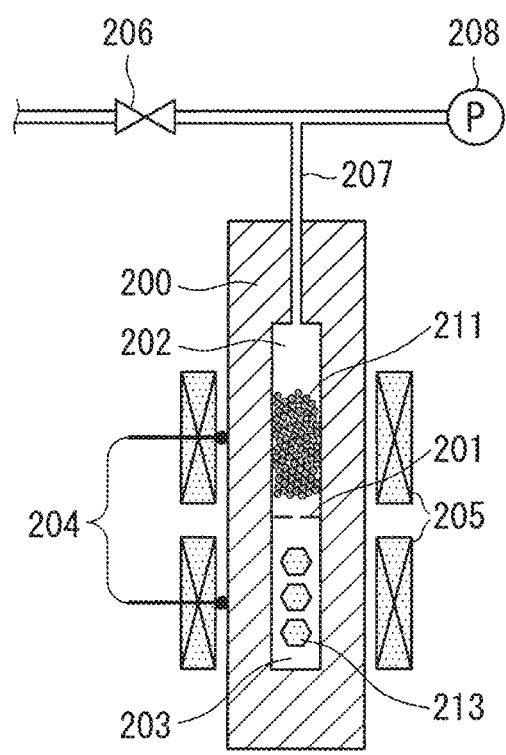

PRESSURE CONTAINER FOR CRYSTAL PRODUCTION

TECHNICAL FIELD

The present invention relates to a pressure container for crystal production using ammonia in a supercritical state or subcritical state as a solvent, a raw material, a mineralizer, and seed crystal.

BACKGROUND ART

An ammonothermal method is a crystal production method using ammonia in a supercritical or subcritical state as a solvent, and is particularly known as a method useful for producing nitride crystal of group 13 element in the periodic table with high purity.

In production with this method, a solvent, a raw material, and a seed crystal are put in a pressure container for crystal production and the pressure container for crystal production is sealed, and a high temperature area and a low temperature area are formed by heating the pressure container for crystal production, a difference in temperature causes the raw material dissolved in the solvent to be recrystallized on the seed crystal. For example, a desired crystal can be produced by dissolving GaN polycrystal which is a raw material in supercritical ammonia and recrystallizing the GaN polycrystal on a GaN single crystal which is a seed crystal. Since the raw material such as GaN has extremely low solubility with respect to ammonia in the critical or subcritical state, a mineralizer is added to improve the solubility and promote crystal growth. The mineralizers are classified into acid mineralizers represented by ammonium halide ($NH_4X$, X=F, Cl, Br, I) and basic mineralizers represented by alkali amide ($NH_2$ X, X=Li, Na, K). An ammonia environment in the supercritical or subcritical state containing mineralizer is a very severe corrosive environment, and there are problems such as deterioration of container safety and contamination of metal impurities into the produced crystal due to corrosion of container structure materials.

As measures against the above problems, it has been proposed to use another material excellent in corrosion resistance as a corrosion resistant portion on the inner surface of the pressure container in contact with the solvent, or to use a reaction container such as a capsule inside the pressure container in some cases.

For example, in PTL 1 to 3, a Ni-based alloy is used as a material of the corrosion resistant portion.

In PTL 4, the fluorine-containing film is used as a corrosion resistant portion.

In PTL 5, a capsule of a malleable metal such as Au, Ag, Cu, or Pt is used as a corrosion resistant portion.

In PTL 6, Pt, Ir, Pt—Ir alloy or the like are used as a corrosion resistant portion.

In PTL 7, Pt, Ir, Au, Ti, V, Zr, Nb, Ta, W and alloys thereof are used as a corrosion resistant portion.

In PTL 8, it is preferable to line or coat a part in contact with ammonia other than a shield portion with a noble metal, and examples of the noble metal include platinum (Pt), gold (Au), iridium (Ir), ruthenium (Ru), rhodium (Rh), palladium (Pd), rhenium (Re), silver (Ag), and alloys having these elements as a main component. Among them, platinum, iridium, or an alloy thereof is considered to be preferable in view of excellence in corrosion resistance.

CITATION LIST

Patent Literature

PTL 1: JP-A-2007-56320
PTL 2: JP-A-2010-222247
PTL 3: JP-A-2015-140288
PTL 4: JP-A-2013-203652
PTL 5: JP-T-2006-513122
PTL 6: JP-A-2006-193355
PTL 7: JP-A-2012-017212
PTL 8: JP-T-2012-176318

SUMMARY OF INVENTION

Technical Problem

However, in a case of the Ni-based alloys and fluorine-containing film of PTL 1 to 4, the corrosion in the ammonia environment including the mineralizer cannot be sufficiently prevented.

In a case where a capsule of a malleable metal such as Au, Ag, Cu, or Pt disclosed in PTL 5 is used as a corrosion resistant portion, there is a problem in that since the metals are soft and thus the capsule is deformed, it cannot be used repeatedly for a long period of time.

In PTL 6 to 8, although Pt or Ir liners are mainly used as a corrosion resistant material and can prevent the corrosion in the ammonia environment including the mineralizer, Pt is expensive, thereby leading to an increase in container production cost. In addition, it is clear that Pt forms a reaction layer by alloying with Ga, and there is a risk of becoming brittle and breaking in use for a long period of time. Also, no specific use has been described for other noble metals.

An object of the present invention is to solve the problems in the related art as described above, and there is provided a pressure container for crystal production which has high corrosion resistance and can be used repeatedly for a long period of time.

Solution to Problem

Among the pressure containers for crystal production of the present invention, the first aspect is that a pressure container for crystal production, the pressure container being configured to produce a crystal using ammonia in a supercritical state or a subcritical state as a solvent, a raw material, a mineralizer, and a seed crystal inside the container, wherein Ag is present at least on the entire surface of an exposed inner surface of the pressure container.

In another aspect of the pressure container for crystal production according to the present invention, the Ag covers the entire inner surface of the pressure container.

In another aspect of the pressure container for crystal production according to the present invention, the crystal is nitride crystal.

In another aspect of the pressure container for crystal production according to the present invention, the mineralizer is a fluorine-based mineralizer and does not contain a halogen atom other than fluorine.

In another aspect of the pressure container for crystal production according to the present invention, wherein the pressure container comprises: a pressure container main body having an opening; and a cover configured to close the opening of the pressure container main body.

In another aspect of the pressure container for crystal production according to the present invention, the pressure container main body has a cylindrical shape, and an Ag liner having a bottomed cylindrical shape and having an opening is disposed on an inner surface of the pressure container main body.

In another aspect of the pressure container for crystal production according to the present invention, the pressure container for crystal production further comprising: a gasket disposed in a gap between the pressure container main body and the cover.

In another aspect of the pressure container for crystal production according to the present invention, wherein the pressure container main body is formed of a pressure container first main body member and a pressure container second main body member, wherein the pressure container second main body member is located on a part or all of an inner surface side of the pressure container first main body member, and wherein the pressure container second main body member is composed of a material that is more excellent in corrosion resistance than the pressure container first main body member.

In another aspect of the pressure container for crystal production according to the present invention, wherein the cover is formed of a first cover member and a second cover member, wherein the second cover member is located on a part or all of an inner surface side of the first cover member, and wherein the second cover member is composed of a material that is more excellent in corrosion resistance than the first cover member.

In another aspect of the pressure container for crystal production according to the present invention, the pressure container main body and the cover are composed of a Ni-based alloy, an iron alloy, a cobalt-based alloy, or alloys combining thereof.

In another aspect of the pressure container for crystal production according to the present invention, the Ag is disposed by a Ag lining, a Ag welding, or a Ag plating, or a combination of two or more thereof.

In another aspect of the pressure container for crystal production according to the present invention, wherein the Ag is disposed by a Ag lining, a Ag welding, or a Ag plating, or a combination of two or more thereof, and wherein the Ag liner is installed up to a mouth part of the pressure container main body having an opening and has a thickness of from 0.5 mm to 20 mm.

In another aspect of the pressure container for crystal production according to the present invention, wherein the Ag is disposed by a Ag lining, a Ag welding, or a Ag plating, or a combination of two or more thereof, wherein the pressure container second main body member is located on an outer periphery side of the Ag welding and the Ag plating, and wherein the pressure container first main body member is located on an outer peripheral side of the pressure container second main body member.

In another aspect of the pressure container for crystal production according to the present invention, wherein the Ag is disposed by a Ag lining, a Ag welding, or a Ag plating, or a combination of two or more thereof, and wherein the second cover member is located on an outer periphery side of the Ag welding and the Ag plating, and the first cover member is located on an outer peripheral side of the second cover member.

In another aspect of the pressure container for crystal production according to the present invention, wherein the Ag is disposed by a Ag lining, a Ag welding, or a Ag plating, or a combination of two or more thereof, and wherein in the Ag welding, an opening upper portion of the Ag liner and the pressure container main body are joined to seal a gap between the Ag liner and the pressure container main body.

In another aspect of the pressure container for crystal production according to the present invention, wherein the Ag is disposed by a Ag lining, a Ag welding, or a Ag plating, or a combination of two or more thereof, and wherein the Ag plating is performed on an inner surface of the pressure container main body except for the Ag liner and an Ag welded portion, an inner surface of the cover, and an inner peripheral surface of a gasket, and the plated layer has a thickness of from 10 μm to 1000 μm.

Advantageous Effects of Invention

As described above, according to the present invention, when Ag is present on the entire surface of at least the exposed inner surface of the pressure container, the corrosion of the inner surface of the pressure container is prevented, the contamination of impurities from the main body, the cover, the gasket and the like can be prevented, and thereby crystal with high purity can be produced. Moreover, a deformation problem of a corrosion resistant portion is solved by not using a capsule method in the structure, and can be repeatedly used for a long period of time.

BRIEF DESCRIPTION OF DRAWINGS

FIG. 1 is a longitudinal sectional view illustrating a pressure container for crystal production according to a first embodiment of the present invention.

Similarly, FIG. 2 is a longitudinal sectional view illustrating a modification example of the first embodiment.

Similarly, FIG. 3 is an enlarged longitudinal sectional view illustrating the vicinity of a mouth part in the first embodiment.

FIG. 4 is a longitudinal sectional view illustrating a pressure container for crystal production according to a second embodiment of the present invention.

Similarly, FIG. 5 is a longitudinal sectional view illustrating a modification example of the second embodiment.

FIG. 6 is a longitudinal sectional view illustrating a pressure container for crystal production according to a third embodiment of the present invention.

Similarly, FIG. 7 is a longitudinal sectional view illustrating a modification example of the third embodiment.

Similarly, FIG. 8 is an enlarged longitudinal sectional view illustrating the vicinity of a mouth part in the third embodiment.

FIG. 9 is a drawing-substituting photograph illustrating an EPMA analysis result after a corrosion test in examples of the present invention.

FIG. 10 is a diagram schematically illustrating a general apparatus for crystal production in an ammonothermal method.

DESCRIPTION OF EMBODIMENTS

Hereinafter, embodiments of the present invention will be described based on the attached drawings.

FIG. 10 is a diagram schematically illustrating a general apparatus for crystal production in an ammonothermal method using a fluorine mineralizer, and the detailed description is omitted.

A pressure container for crystal production 200 is vertically disposed, a baffle plate 201 is disposed at the center in a height direction, and an internal space is divided into an upper raw material filled area 202 and a lower crystal growth area 203. A raw material 211 is disposed in the raw material filled area 202, and seed crystal 213 is disposed in the crystal growth area 203 so as to perform crystal production.

An electric furnace 205 is circumferentially disposed on the outer periphery of the pressure container for crystal production 200, and a thermocouple 204 is attached to the pressure container for crystal production 200. Further, a conduit 207 is connected to the pressure container for crystal production, and a high pressure valve 206 is interposed in the conduit 207. In addition, the conduit 207 is provided with a pressure gauge 208 that measures the pressure in the conduit 207.

In the pressure container for crystal production 200, heating is performed by the electric furnace 205 while measuring a temperature by the thermocouple 204. In the internal space, a difference in temperature is generated between the upper portion and the lower portion of the container as a system of high temperature and high pressure, and with this difference in temperature, the crystal production is performed using the difference in crystal solubility of the raw material in the solvent. The crystal may be nitride crystal.

Embodiment 1

Next, details of the pressure container for crystal production in the present embodiment will be described based on FIG. 1 to FIG. 3. In the following description, the configuration will be described in a state where an axial center of a pressure container for crystal production 1 is made vertical.

The pressure container for crystal production 1 includes a pressure container main body 10, a cover 11 for closing an opening 100 in an upper portion of the pressure container main body 10, and a gasket 12 disposed in a gap between the pressure container main body 10 and the cover 11. In the present embodiment, a small circular cylindrical gasket 12 is interposed between an upper surface of a mouth part 101 of the opening 100 and a lower surface of an inner peripheral side edge portion of the cover 11. The gasket 12 can be made of metal, and can be made of a nickel-chromium alloy or a nickel-chromium-molybdenum alloy in consideration of strength and sealing property.

A flange is provided on each of the outer peripheral surface side on the upper end side of the pressure container main body 10 and the outer peripheral surface side on the lower end side of the cover 11, and the pressure container main body 10 and the cover 11 are fixed by a clamp 13 sandwiching these flanges from the outer side in the vertical direction.

Further, the gasket 12 includes an annular projection 12A projecting outward on the small circular cylindrical outer peripheral surface side, and the annular projection 12A is inserted into a gap between the upper surface of the mouth part 101 and the lower surface of the cover 11, and by the fixing of the clamp 13, the gap is sealed by bringing the inner surface and the upper surface of the mouth part 101 into close contact with the inner surface and the lower surface of the edge portion of the cover 11, respectively.

One or both of the pressure container main body 10 and the cover 11 are formed of a first member and a second member, and each second member may be located on a part or all of the inner surface side of each first member.

The pressure container main body 10 is formed of a pressure container first main body member 10A and a pressure container second main body member 10B, and the pressure container second main body member 10B may be located on a part or all on the inner surface side of the pressure container first main body member 10A.

The cover 11 may be formed of a first cover member 11A and a second cover member 11B, and the second cover member 11B may be located on a part or all of the inner surface side of the first cover member 11A.

The pressure container main body 10 is formed of the pressure container first main body member 10A as a whole with a cylindrical shape having a bottom, and in the mouth part 101, an annular recessed portion is provided on the inner peripheral surface side and the upper surface side of the pressure container first main body member 10A, and the annular pressure container second main body member 10B is fitted into this recessed portion. The exposed inner peripheral surface of the pressure container first main body member 10A and the exposed inner surface of the pressure container second main body member 10B have a shape which is flush with the inner peripheral face and the upper surface. Therefore, in the pressure container main body 10, the pressure container second main body member 10B is located only on the mouth part side. That is, the pressure container second main body member 10B is located at an upper end edge 10A1 of an inner peripheral surface of the pressure container first main body member 10A.

In addition, the cover 11 includes a first cover member 11A that forms the entire shape, and includes a conduit 110 vertically penetrating in the center of the first cover member. An annular groove is provided in an inside area on the lower surface of the first cover member 11A, and a second cover member 11B is provided in the annular groove and on the inner peripheral surface side of the conduit 110. The second cover member 11B on the inner lower surface of the first cover member 11A and the lower surface of the first cover member 11A on the outer peripheral side thereof have a flush shape.

A material having high temperature strength and corrosion resistance may be used for the pressure container first main body member 10A and the first cover member 11A, and a material having more excellent corrosion resistance than the first members thereof may be used for the pressure container second main body member 10B and the second cover member 11B. The pressure container main body 10 and the cover 11 can be formed of metal, and preferably, can be formed of a Ni-based alloy, an iron alloy, a cobalt-based alloy, or alloys combining these.

For example, in a case of using Inconel (trademark, the same applies to the following) Alloy 706, Inconel Alloy 718, Inconel Alloy 740, and the like as a material used for the pressure container first main body member 10A and the first cover member 11A, for example, a material such as Inconel Alloy 625 can be used for the pressure container second main body member 10B and the second cover member 11B.

Ag may cover the entire surface of at least the exposed inner surface of the pressure container, or may be disposed by a Ag lining, a Ag welding, or a Ag plating, or a combination of two or more thereof.

The pressure container main body 10 has a cylindrical shape, and a cylindrical Ag liner 14 having a bottom and an opening is disposed on the inner surface thereof. In the present embodiment, the cylindrical Ag liner 14 having a bottom along the inner peripheral surface and the bottom surface is fitted and mounted in a cylindrical hole, and an upper end of the Ag liner 14 extends near the mouth part 101 of the pressure container main body 10. The upper end of the Ag liner 14 extends from the upper end of the mouth part 101 to a position slightly below, and the second main body member 10B is located on the outer peripheral side of the upper end portion of the Ag liner 14. As a result, the vicinity of the upper end side of the Ag liner 14 is in contact with the second main body member 10B on the outside thereof. The thickness of the Ag liner is not particularly limited, and can be set to, for example, 0.5 mm to 20 mm. Preferably, it is 1 mm to 5 mm. The Ag liner 14 is mounted up to the mouth part 101 of the pressure container main body 10 having an opening, and the thickness can be in the range of 0.5 mm to 20 mm. If the thickness is excessively thin, the material on the outside may be corroded in a case where the Ag liner is broken or the like. On the other hand, if the thickness is excessively thick, there are some problems as follows:

(1) It is difficult to produce an Ag liner, and the production cost is increased;

(2) It is difficult to perform the Ag welding to seal the opening upper portion of the Ag liner and the mouth part of the pressure container main body; and (3) If the thickness is thick, the rigidity is too high to be deformed, and thus considerable accuracy is required when incorporating the Ag liner into the main body.

The Ag liner is easy to produce and is a desirable form in consideration of the ease of bonding to the mouth part of the pressure container main body and the production cost.

The Ag liner 14 has an Ag welded portion 15 formed on an area between the upper end surface thereof and the second main body member 10B. In the Ag welding, the opening upper portion of the Ag liner 14 and the pressure container main body 10 are joined to seal a gap between the Ag liner 14 and the pressure container main body 10. In the area between the outer peripheral end surface of the Ag liner 14 and the inner surface of the second main body member 10B, the Ag welded portion 15 is desirable to have a thickness of 0.5 mm to 20 mm, and is even more desirable to have a thickness of 1 mm to 5 mm, on the basis of the gap end between the outer peripheral end surface of the Ag liner 14 and the inner surface of the second main body member 10B. The gap between the outer peripheral end surface of the Ag liner 14 and the second main body member 10B is sealed by the Ag welded portion 15 to prevent the progress of corrosion in the gap.

In addition, although the method of Ag welding is not particularly limited, the Ag welding can be performed by TIG welding using Ag wire or the like.

The reason for disposing the second main body member 10B on the outer peripheral side of the Ag liner 14 is to prevent the progress of corrosion on the outside when the Ag welded portion or the like is broken. In this embodiment, the second main body member 10B is disposed around the opening of the Ag liner 14, but as in the embodiment to be described later, the second main body member 10B may be disposed so as to substantially cover the entire inner peripheral side of the first main body member 10A or may not be disposed. The method of disposing the second main body member 10B on the inner peripheral side of the first main body member 10A is not particularly limited, and an appropriate method such as lining can be used.

Moreover, in the pressure container for crystal production 1, at least the exposed inner surface of the portion which cannot be covered with the Ag liner can be plated with Ag. Specifically, Ag plating 16A is applied circumferentially on the surface of the second main body member 10B located at the upper end edge of the inner peripheral surface of the cylindrical hole which is not covered by Ag welding at the mouth part 101 of the pressure container main body 10. Similarly, Ag plating 16C is applied to the inner surface of the second cover member 11B located on the lower surface of the cover 11 and the inner surface of the second cover member 11B on the inner peripheral surface of the conduit 110. In this case, at least the exposed inner surface may be plated with Ag. Further, Ag plating 16B is applied to the entire surface of the gasket 12. In the gasket 12, Ag plating may be applied only to the inner peripheral surface. In a case where the Ag plating is applied to the entire surface of the gasket 12, a plating operation can be easily performed since selection of a plating site is unnecessary, and even in a case where the plating is broken at the edge side of the inner peripheral surface of the gasket 12, it is possible to suppress the progress of the corrosion to the outer peripheral side by the Ag plating. Preferably, the respective second members are located on the outer peripheral side of the Ag welded portion and the Ag plating, and the respective first members are positioned on the outer peripheral side of the respective second members. As a result, the respective second members are located outside the Ag plating, and in a case where the Ag plating is damaged or the like, it is possible to suppress the progress of corrosion.

Further, at a boundary between the outer peripheral surface edge of the gasket 12 and each of the second members, it is desirable that the area of the Ag plating on each of the second members extends so as to reach the outer peripheral side of the gasket 12. Thereby, the surface of each second member can be reliably covered with Ag to suppress corrosion.

In the Ag plating, the thickness of the plated layer is preferably 10 μm to 1000 μm, and is more preferably 30 μm to 200 μm. The thickness can be selected in consideration of the long-term use of the Ag plated layer and the quality of the Ag plated layer.

The Ag plating is performed on the inner surface of the pressure container main body 10 except for the Ag liner and the Ag welded portion, the inner surface of the cover, and the inner peripheral surface of the gasket, and the thickness of the plated layer can be 10 μm to 1000 μm.

In the present invention, the method of plating is not particularly limited, and known methods can be adopted as appropriate.

Next, FIG. 2 illustrates a pressure container for crystal production 1A of a modification example in the Embodiment 1. In addition, the same symbols are attached to the same component as those in the Embodiment 1 as described above, and the description thereof is omitted or simplified.

In this embodiment, in consideration of the size of the pressure container, the bottom of the pressure container main body 10 can be configured not only to have a blind hole but also to be pierced and sealed in a Bridgman manner. Specifically, the bottom of the pressure container main body 10 is opened, and a Bridgman seal 19 is inserted into the opening.

An upper side of the Bridgman seal 19 has a second main body member 18A surrounding the bottom of the Ag liner 14, and the outer peripheral side surface of the upper end of the Bridgman seal 19 is in contact with the first main body member 10A. On the lower side thereof, a second main body member 18B is provided between the first main body member 10A and the outer circumference side of the Bridgman seal 19.

The pressure container for crystal production as illustrated in FIGS. 1 to 3 has the following features:

(a) The pressure container is formed of a main body, a cover, and a gasket;

(b) The inner surface of the pressure container is covered with a combination of Ag-TIG welding using Ag liner or Ag wire and Ag plating;

(c) The Ag liner is mounted up to the mouth part of the pressure container main body, and has a thickness of 0.5 mm to 20 mm, and the thickness is preferably 1 mm to 5 mm;

(d) The Ag-TIG welding using the Ag wire seals the opening upper portion of the mounted Ag liner and the pressure container main body; and (e) The Ag plating is performed on the inner surface of the pressure container main body except for the Ag-TIG weld using the Ag liner and the Ag wire, the inner surface of the cover, and the inner peripheral surface of the gasket (where it is difficult to mount the Ag liner), and the thickness of the plated layer is 10 µm to 1000 µm, and is preferably 30 µm to 200 µm.

In the embodiment of the present invention, at least the exposed inner surface of the pressure container main body is coated with Ag on the entire surface by a Ag lining, a Ag welding, or a Ag plating, or a combination of two or more thereof.

The corrosion resistant portion of the inner surface of the pressure container main body 10 in contact with the solvent may be coated with the Ag welding, coated with the Ag plating, or a combination thereof, in addition to the above configuration.

The material in the pressure container for crystal production can be formed of a Ni-based alloy, an iron alloy, a cobalt-based alloy, or a combination thereof, and these materials are substantially corroded by supercritical (subcritical) ammonia. However, coating with Ag can effectively prevent corrosion. When the corrosion resistant portion is composed of a Ni-based alloy or the like, there is a problem in that impurities are mixed into the crystal during crystal growth.

Further, in a case of the Ag welded portion and the Ag plating, since the damage is more likely to occur than the Ag liner, each of the second members is disposed on the outer side thereof.

Also, at the inner surface of the pressure container, it is not desirable to dispose Ag on only a part of the inner surface of the pressure container. During the crystal growth, ammonia in a supercritical state or a subcritical state as a solvent is in contact with all the inner surfaces of the pressure container (main body, gasket, and cover). For example, in a case where Ag is disposed only in the main body and Ag is not present on the inner surface of the gasket or the cover in the pressure container, contamination of metal impurities from the exposed portion to the produced crystal occurs. Therefore, it is necessary for Ag to present on the entire surface of the exposed inner surface in the pressure container.

Here, the supercritical state refers to a state in which the temperature and pressure are higher than a critical point determined for each substance, and the subcritical state refers to a state in which the temperature and pressure do not reach the critical point but are near the critical point.

Incidentally, Ag shows remarkable corrosion resistance in a case where a mineralizer is a fluorine-based mineralizer and does not contain a halogen atom other than a fluorine. In a case where the mineralizer contains Cl, Br, or I, it is difficult to completely prevent the dissolution of Ag. Further, when the corrosion resistant portion is composed of Pt or the like, it is expensive and causes problems in long-term use due to alloying with Ga. In addition, since the Ag capsule is soft, it is easily deformed by pressure, and thereby it is difficult to use for a long period of time.

In the present embodiment, the mineralizer is limited to one containing only fluorine, and by making the inner surface of the pressure container have Ag on its entire surface, the corrosion resistance is higher and a pressure container for nitride crystal production which can be used repeatedly for a longer period of time can be produced.

In this embodiment, ammonia in a supercritical state or a subcritical state is used as a solvent, and the mineralizer is a fluorine-based mineralizer and does not contain a halogen atom other than fluorine. That is, a mineralizer containing only a fluorine atom is used as a halogen atom. Examples of the mineralizer not containing halogen atoms other than such fluorine include fluorides such as ammonium fluoride, hydrogen fluoride, nitrogen trifluoride, and fluorides of metals such as gallium fluoride and aluminum fluoride. Among these, ammonium fluoride, gallium fluoride, and aluminum fluoride are preferable, and ammonium fluoride and gallium fluoride are more preferable.

In addition, Ag exhibits excellent corrosion resistance when it contains only fluoride as a mineralizer. Ag will dissolve if it contains other halides. That is, it is important that the mineralizer does not contain a halogen atom other than fluorine.

As a temperature range in the pressure container for crystal production to be in the supercritical or subcritical state, the lower limit is generally 150° C. or higher, is preferably 200° C. or higher, and is particularly preferably 300° C. or higher, and the upper limit is generally 800° C. or lower, is preferably 700° C. or lower, and is particularly preferably 625° C. or lower. The temperature range is preferably 150° C. to 800° C., is more preferably 200° C. to 700° C., and is still more preferably 300° C. to 625° C. Also, in the pressure range in the autoclave, the lower limit is generally 20 MPa or more, is preferably 30 MPa or more, is more preferably 50 MPa or more, and is particularly preferably 80 MPa or more, and the upper limit is generally 500 MPa or less, is preferably 400 MPa or less, is more preferably 300 MPa or less, and is particularly preferably 200 MPa or less. The preferable pressure range is 20 to 500 MPa, is more preferably 50 to 300 MPa, and is still more preferably 80 to 200 MPa.

By holding the pressure container for crystal production for several hours to several hundred days in this state, the difference in temperature between the lower and upper portions of the pressure container for crystal production causes convection from the upper portion to the lower portion in the pressure container for crystal production, and dissolution of the raw material disposed on the upper portion and crystal growth from the seed crystals on the lower portion occur. The temperature of the lower portion of the pressure container for crystal production is also lower than that of the upper portion, but it is in the supercritical or subcritical state described above, and the pressure container main body 10, the cover 11, and the vicinity of the gasket 12 of the pressure container for crystal production are in the same state.

As described above, the inside of the pressure container for crystal production is in the supercritical or subcritical ammonia atmosphere. In particular, it is effective in preventing the contamination of impurities into the solvent and the deterioration of crystal quality due to corrosion from the gasket 12 where the lining of corrosion resistant materials such as platinum, gold, iridium, tungsten, and molybdenum is difficult in terms of sealing property.

Embodiment 2

Next, another Embodiment 2 and modification thereof will be described based on FIGS. 4 and 5. Incidentally, the same symbols are attached to the same component as those in the embodiment as described above, and the description thereof is omitted or simplified.

In the pressure container main body 10 of the embodiment, although the second main body member 10B is disposed on only a part of the inner surface of the first main body member 10A, in the pressure container main body 20 of the pressure container for crystal production 2 of this embodiment, a cylindrical second main body member 20B having a bottom is provided on almost the entire inner surface (except for the upper end portion) of a cylindrical first main body member 20A having a bottom, that is, on the inner peripheral surface and the bottom surface. In this embodiment, even if damage or the like occurs in any part of the Ag liner 14, since the second main body member 20B is located on the outer peripheral side, the progress of corrosion can be suppressed.

FIG. 5 illustrates a configuration of a pressure container for crystal production 2A in which the Bridgman seal 19 is provided at the bottom of the pressure container main body 20.

In the Embodiments 1 and 2, each second member is described as one material, but it is also possible to configure the second member with a plurality of layers of different materials.

Embodiment 3

In the above embodiments, it has been described that the second members are disposed on the outer peripheral side of the Ag liner 14 and the lower surface side of the cover 11, respectively; however, in the present invention, it is possible to have a configuration in which either or both of the second members are not disposed.

FIGS. 6 to 8 illustrate a pressure container for crystal production 3 in which the Ag liner 14 is disposed directly inside the first main body member 30 of the pressure container main body 10, and the cover 11 is formed of only the first member. The upper end surface of the Ag liner 14 and the inner surface of the first main body member 30 are welded to form the Ag welded portion 15.

In this embodiment, the inner surface of the pressure container main body 10 or the cover 11 may be damaged in a case where the Ag liner or the Ag plating is damaged; however, since the corrosion resistance has been achieved by the Ag liner or Ag plating, the occurrence of problems can be reduced. In addition, the occurrence of damage can be delayed by making the thickness of the Ag liner relatively thicker than that in a case of using the second main body member or making the thickness of the plating thicker. In addition, depending on the difference in crystal production conditions or the like, the Embodiment 3 can be used without causing any problem.

FIG. 7 illustrates a configuration of a pressure container for crystal production 3A in which the Bridgman seal 19 is provided at the bottom of the pressure container main body 10, and FIG. 8 is an enlarged drawing of longitudinal section illustrating the vicinity of the mouth part in FIGS. 6 and 7.

EXAMPLES

A material with Ag coated on a surface and a material with Pt coated on a surface were prepared as test materials, and the test materials were disposed in a pressure container main body instead of the seed crystal by simulating an ammonothermal method so as to conduct a test under the conditions of upper temperature: 575° C./lower temperature: 625° C., pressure: 100 MPa, type of mineralizer: ammonium fluoride, and time: 72 hours.

As a result, as illustrated in the photograph of FIG. 9, it was confirmed that a damage in Ag was not observed in the material coated with Ag; however, in the material coated with Pt, Pt reacted with Ga of the polycrystalline GaN as a raw material to form an alloy.

As described above, although the invention was described based on the embodiments, the present invention is not limited to the contents of the above description, and appropriate modifications can be made to the contents described in the present embodiment without departing from the scope of the present invention.

INDUSTRIAL APPLICABILITY

In the pressure container for crystal production according to the present invention, when Ag is present on the entire surface of at least the exposed inner surface of the pressure container, the corrosion of the inner surface of the pressure container is prevented, the contamination of impurities from the pressure container main body, the cover, the gasket and the like can be prevented, and thereby crystal with high purity can be produced. In addition, the deformation problem of the corrosion resistant portion is solved by the structure, and it is possible to provide a pressure container for crystal production which can be repeatedly used for a long period of time.

Although the present invention has been described in detail and with reference to specific embodiments, it will be apparent to those skilled in the art that various changes and modifications can be made without departing from the spirit and scope of the invention.

This application is based on Japanese Patent Application (Japanese Patent Application No. 2017-076804) filed on Apr. 7, 2017, the contents of which are incorporated herein by reference.

REFERENCE SIGNS LIST 1, 1A, 2, 2A, 3, 3A Pressure container for crystal production
10 Pressure container main body
10A First main body member
10B Second main body member
11 Cover
11A First cover member
11B Second cover member
12 Gasket
14 Ag liner
15 Ag welded portion
16A Ag plating
16B Ag plating
16C Ag plating
20 Pressure container main body
20A First main body member
20B Second main body member
30 First main body member
100 Opening
101 Mouth part

The invention claimed is:
1. A pressure container for crystal production containing:
a pressure container main body having an opening; and
a cover configured to close the opening of the pressure container main body, wherein the pressure container is configured to produce a crystal using ammonia in a supercritical state or a subcritical state as a solvent, a raw material, a mineralizer, and a seed crystal inside the container, and wherein Ag is present at least on an entire surface of an inner surface of the pressure container configured to be in contact with the solvent, the entire surface where the Ag is present including at least:

an inner surface of the pressure container main body comprising a Ag liner;

an inner surface of a portion comprising a Ag plating layer, the portion being located at an upper end edge of the pressure container main body and being not covered with the Ag liner; and an inner surface of the cover.

2. The pressure container for crystal production according to claim 1,
wherein the crystal is nitride crystal.

3. The pressure container for crystal production according to claim 1,
wherein the mineralizer is a fluorine-based mineralizer and does not contain a halogen atom other than fluorine.

4. The pressure container for crystal production according to claim 1,
wherein the pressure container main body has a cylindrical shape, and the Ag is disposed as the Ag liner having a bottomed cylindrical shape on the inner surface of the pressure container main body.

5. The pressure container for crystal production according to claim 1, further comprising:
a gasket disposed in a gap between the pressure container main body and the cover.

6. The pressure container for crystal production according to claim 1,
wherein the pressure container main body is formed of a pressure container first main body member and a pressure container second main body member,
wherein the pressure container second main body member is located on a part or all of an inner surface side of the pressure container first main body member, and
wherein the pressure container second main body member is composed of a material that is more excellent in corrosion resistance than the pressure container first main body member.

7. The pressure container for crystal production according to claim 6,
wherein the Ag is disposed by the Ag liner, a Ag welding, and a Ag plating,
wherein the pressure container second main body member is located on an outer periphery side of the Ag welding and the Ag plating, and
wherein the pressure container first main body member is located on an outer peripheral side of the pressure container second main body member.

8. The pressure container for crystal production according to claim 1,
wherein the cover is formed of a first cover member and a second cover member,
wherein the second cover member is located on a part or all of an inner surface side of the first cover member, and
wherein the second cover member is composed of a material that is more excellent in corrosion resistance than the first cover member.

9. The pressure container for crystal production according to claim 8,
wherein the Ag is disposed by the Ag liner, a Ag welding, and a Ag plating,
wherein the second cover member is located on an outer periphery side of the Ag welding and the Ag plating, and
wherein the first cover member is located on an outer peripheral side of the second cover member.

10. The pressure container for crystal production according to claim 1,
wherein the pressure container main body and the cover are formed of a Ni-based alloy, an iron alloy, a cobalt-based alloy, or alloys combining thereof.

11. The pressure container for crystal production according to claim 1,
wherein the Ag is disposed by the Ag liner, a Ag welding, or a Ag plating, or a combination of two or more thereof.

12. The pressure container for crystal production according to claim 1,
wherein the Ag is disposed by the Ag liner, a Ag welding, or a Ag plating, or a combination of two or more thereof, and
wherein the Ag liner is installed up to a mouth part of the pressure container main body having an opening and has a thickness of from 0.5 mm to 20 mm.

13. The pressure container for crystal production according to claim 1,
wherein the Ag is disposed by the Ag liner, a Ag welding, and a Ag plating, and
wherein the Ag welding joins an upper portion of an opening of the Ag liner and the pressure container main body to seal a gap between the Ag liner and the pressure container main body.

14. The pressure container for crystal production according to claim 1,
wherein the Ag is disposed by the Ag liner, a Ag welding, and a Ag plating,
wherein the Ag plating is performed on:
the inner surface of the pressure container main body except for the Ag liner and a Ag welded portion;
the inner surface of the cover; and
an inner peripheral surface of a gasket, and
wherein the Ag plating layer has a thickness of from 10 μm to 1000 μm.

15. The pressure container for crystal production according to claim 1,
wherein the inner surface of the cover comprises the Ag plating layer.

16. A pressure container for crystal production containing:
a pressure container main body having an opening; and
a cover configured to close the opening of the pressure container main body,
wherein the pressure container is configured to produce a crystal using ammonia in a supercritical state or a subcritical state as a solvent, a raw material, a mineralizer, and a seed crystal inside the container, and
wherein the pressure container main body is formed of a pressure container first main body member and a pressure container second main body member, and
wherein Ag is present at least on an entire surface of an inner surface of the pressure container configured to be in contact with the solvent, the entire surface where the Ag is present including at least:
an inner surface of the pressure container second main body member;

an inner surface of the pressure container first main body member comprising a Ag liner; and
an inner surface of the cover.

17. The pressure container for crystal production according to claim 16,
wherein the second main body member is located at an upper end edge of the inner peripheral surface of the first main body member.

18. The pressure container for crystal production according to claim 16,
wherein the second main body member is disposed on only a part of the inner surface of the first main body member.

* * * * *